United States Patent
Mimura et al.

[11] Patent Number: 5,433,822
[45] Date of Patent: Jul. 18, 1995

[54] METHOD OF MANUFACTURING SEMICONDUCTOR DEVICE WITH COPPER CORE BUMPS

[75] Inventors: Seiichi Mimura; Junichiro Shimizu; Takayuki Tajiri; Shingo Ichikawa; Hiroyuki Kaneko; Masayuki Ohi, all of Tokyo, Japan

[73] Assignee: Citizen Watch Co., Ltd., Tokyo, Japan

[21] Appl. No.: 962,190

[22] Filed: Dec. 22, 1992

[30] Foreign Application Priority Data

| Apr. 26, 1991 | [JP] | Japan | 3-122903 |
| Sep. 20, 1991 | [JP] | Japan | 3-268507 |
| Oct. 4, 1991 | [JP] | Japan | 3-284066 |

[51] Int. Cl.⁶ .......... B44C 1/22; C03C 15/00; C03C 25/06; C23F 1/00
[52] U.S. Cl. .......... 156/659.1; 257/737; 257/762
[58] Field of Search ........ 257/698, 693, 780, 781, 257/737, 738, 762; 437/183; 361/398, 406, 404, 402, 397, 406, 409; 156/659.1, 661.1; 430/318, 325

[56] References Cited

U.S. PATENT DOCUMENTS

| 4,926,241 | 5/1990 | Carey | 257/698 |
| 4,927,700 | 5/1990 | Nelson et al. | 361/398 |
| 4,991,060 | 2/1991 | Kawakami et al. | 361/406 |
| 5,065,228 | 11/1991 | Foster et al. | 257/698 |

FOREIGN PATENT DOCUMENTS

| 2609841 | 7/1988 | France |  |
| 53-44172 | 4/1978 | Japan |  |
| 61-78141 | 4/1986 | Japan |  |
| 1-60551 | 4/1989 | Japan |  |
| 1-204553 | 8/1989 | Japan |  |
| 2-102738 | 8/1990 | Japan |  |
| 2-23928 | 9/1990 | Japan | 437/183 |
| WO89/07339 | 8/1989 | WIPO |  |
| WO90/13991 | 11/1990 | WIPO |  |

OTHER PUBLICATIONS

IBM Technical Disclosure Bulletin, vol. 20, No. 10, 03/1978, p. 3872.
Patent Abstracts of Japan, vol. 10, No. 99, Apr. 16, 1986.
Patent Abstracts of Japan, vol. 12, No. 167, May 19, 1988.
GAAS IC Symposium, Oct. 23, 1984, Boston, pp. 63–65.

Primary Examiner—Sara W. Crane
Assistant Examiner—S. V. Clark
Attorney, Agent, or Firm—Kanesaka & Takeuchi

[57] ABSTRACT

A semiconductor device has circuit patterns formed on upper and lower surfaces of a laminated board with both surfaces lined with copper and interconnected by through holes, an IC chip mounted on the upper pattern, and external connection terminals mounted on the lower pattern, the external connection terminals comprising copper core bumps. According to a method of manufacturing such a semiconductor device, the same etching process as pattern etching for forming the circuit pattern are effected in bump forming regions on the circuit pattern formed by the resist pattern.

5 Claims, 13 Drawing Sheets

METHOD OF MANUFACTURING SEMICONDUCTOR DEVICE WITH COPPER CORE BUMPS

TECHNICAL FIELD

The present invention relates to a method of manufacturing a structure of external connection terminals of a semiconductor device of the surface-mounted type or the like having a copper-lined laminated board having both surfaces lined with copper, i.e. semiconductor device having copper core bumps as external connection terminals for better reparability and heat radiation.

BACKGROUND ART

In recent years, efforts have been made to use pin grid arrays (PGA) in a wider range of applications by replacing mounted IC chips for conversion into other functions. To adapt PGAs for such use, ceramic has been employed as the material of PGA circuit boards.

Ceramic boards have high product reliability as they are of high insulation and heat radiation capabilities. However, ceramic boards are disadvantageous in that they shrink when interconnection patterns are printed and baked, and that it is difficult to increase the number of interconnection patterns or make fine patterns on the ceramic boards. For this reason, if more interconnection patterns are formed in PGAs with ceramic boards, it results in larger PGAs and more expensive semiconductor devices.

In view of the above shortcomings of ceramic boards, there have been proposed various semiconductor devices which employ resin circuit boards rather than ceramic circuit boards. Semiconductor devices with resin circuit boards offer advantages in that fine patterns can be made on the resin circuit boards and the resultant semiconductor devices are inexpensive. However, the semiconductor devices with resin circuit boards have not been in widespread use because of a heat radiation problem.

More specifically, an LSI circuit with a largesize IC mounted thereon generates a large amount of heat inducted by an operating current. Unless the generated heat is radiated out quickly, the temperature of the IC increases, with the results that the operating speed of the IC is lowered and the IC suffers a thermal breakdown.

Semiconductor devices with resin boards, whose structure is improved for better heat radiation, are disclosed in Japanese laid-open patent publications Nos. 1-204453 and 2-102738. The disclosed structure will be described below with reference to FIGS. 13 and 14 of the accompanying drawings.

FIG. 13 shows in cross section a conventional resin-board pin grid array (PPGA). As shown in FIG. 13, an IC chip 3 is placed on a die bond pattern 2a of a resin board 1. As known in the art, the IC chip 3 is connected to a pattern 2d by wires 108 on the resin board 1. The IC chip 3 is sealed in an injection-molded resin block 4 with a heat radiation plate 107 fixed to the upper surface of the injection-molded resin block 4 by integral molding. A lower pattern 2b is disposed on a lower surface of the resin board 1 at a position corresponding to the die bond pattern 2a.

The die bond pattern 2a has a portion 2c extending into a region where contact pins 120 are mounted. The portion 2c has a through hole 2e defined therein, and a contact pin 120a is soldered in the through hole 2e. The contact pin 120a extends through the through hole 2e, and is soldered to the lower pattern 2b. Therefore, heat from the IC chip 3 can be radiated out through the die bond pattern 2a, the contact pin 120a, and the lower pattern 2b.

FIG. 14 shows in cross section another conventional PPGA. A die bond pattern 2a has a plurality of through holes 110 arranged in its plane and held in direct contact with a lower pattern 2b on a resin board 1. Therefore, heat from an IC chip 3 is propagated through the through holes 110, and radiated out from the wide area of the lower pattern 2b.

The PPGA is a promising semiconductor device as it is less expensive than the PGA with the ceramic substrate and has a heat radiation capability.

However, since large chips are employed as the capacity of semiconductor memories increases, PPGAs used are expensive and cannot simply be scrapped after use. Usually, it is necessary to remove PPGAs from motherboards and then install them on other motherboards for reuse.

Even if a PPGA is removed with heat from a motherboard so that it will be installed on another motherboard, the reparability of the PPGA is not impaired because the contact pins 120, 120a remain unchanged in shape. There is no heat problem since heat from the IC chip 3 can be radiated through the through holes. However, inasmuch as PPGAs require 100 or more contact pins 120 as external connection terminals, they are manufactured in a large number of steps and are highly costly.

One design which is now under consideration for solving the cost problem of the PPGAs and reducing the cost thereof is a surface-mounted semiconductor (memory) device.

Conventional surface-mounted memory devices will be described below with reference to FIGS. 15 and 16 of the accompanying drawings.

FIG. 15 shows in cross section a pin-type memory device 100. Circuit patterns on upper and lower surfaces of a circuit board 1 are interconnected by through holes (not shown). An IC chip 3 is mounted on the upper pattern 2 and molded in a sealing resin block 4. Short pins 6 are mounted as external connection terminals on the lower pattern 5, the short pins 6 being inserted in the non-illustrated through holes. To mount the memory device 100 on a motherboard, a solder-plated layer or a conductive adhesive is applied to a pattern on the motherboard, and then the pins 6 of the memory device 100 are positioned and placed on the pattern. Thereafter, the assembly is heated to melt the solder-plated layer or the conductive adhesive, thereby surface-mounting the memory device 100 on the motherboard.

FIG. 16 shows in cross section a memory device of the solder-bump type. Parts shown in FIG. 16 which are identical to those of the memory device 100 shown in FIG. 15 are denoted by identical reference numerals, and will not be described in detail. The memory device, designated by 200 in FIG. 16, is different from the memory device 100 shown in FIG. 15 in that external connection terminals comprise solder bumps 7. To mount the memory device 200 on a motherboard, the solder bumps 7 of the memory device 200 are positioned and placed directly on a pattern on the motherboard. Then, the assembly is heated to melt the solder bumps 7, thereby surface-mounting the memory device 100 on the motherboard.

When the pin-type memory device 100 shown in FIG. 15 is removed with heat from the motherboard so that it will be installed on another motherboard, the reparability of the memory device 100 is not impaired because the pins 6 remain Unchanged in shape. However, inasmuch as the memory device 100 requires 100 or more pins 6 as external connection terminals as in the PPGA, a large number of steps are required to manufacture the memory device 100, and hence the memory device 100 has no merit with respect to the cost.

The solder-bump-type memory device 200 shown in FIG. 16 is advantageous as to the cost because it employs solder bumps that do not require a large number of manufacturing steps. However, when the solder bumps 7 are melted to remove the memory device 200 from the motherboard for the purpose of mounting the memory device 200 on another motherboard, the solder bumps 7 are no longer in good shape, making it difficult to mount the memory device 200 on the other motherboard. That is, the reparability of the memory device 20 is poor.

It is therefore an object of the present invention to provide a surface-mounted semiconductor device having good heat radiation capability and reparability and a method of manufacturing such a semiconductor device at a low cost, by eliminating the above problems which the conventional surface-mounted semiconductor devices have suffered.

DISCLOSURE OF THE INVENTION

The present invention is based on an application of the technology of copper core bumps used as projecting electrodes of IC chips (see, for example, "Bare chip packaging" published by Technical Information Association, Jan. 31, 1991). According to the present invention, copper core bumps are directly formed as external connection electrodes on a lower pattern formed of copper foil on a circuit board 0f a semiconductor device.

More specifically, in a semiconductor device having circuit patterns formed on upper and lower surfaces of a laminated board with both surfaces lined with copper and interconnected by through holes, an IC chip mounted on the upper pattern, and external connection terminals mounted on the lower pattern, the external connection terminals are formed of copper core bumps. The semiconductor device has reparability and is of low cost.

Through holes are defined between the die bond pattern and the lower pattern, and the copper core bumps are formed on lands around the through holes for heat radiation. The heat radiation capability of the semiconductor device is thus improved without any special members. The heat radiation capability is enhanced by thermally conductive members in the through holes.

The present invention directed to a method of manufacturing a semiconductor device by forming copper core bumps on a circuit pattern on a circuit board by way of plating using a resist pattern, uses the same etching process as pattern etching for forming the circuit pattern, in bump forming regions on the circuit pattern formed by the resist pattern.

Since an activation etching step using the same type of etching solution as the pattern etching is added prior to the step of plating the copper core bumps, the adhesion of the copper core bumps can be increased without obstructing the arrangement of a mass-production line. This is highly effective in reducing the cost by way of mass production of semiconductor device and increasing the reliability of the semiconductor device.

According to the present invention, there is also provided a method of manufacturing a semiconductor device by forming copper core bumps on a circuit pattern on a circuit board by way of plating using a resist pattern, characterized by forming a solvent-reactive first dry film and a water-soluble second dry film as successive layers as the resist pattern, and removing the second dry film after the copper core bumps are formed.

Each of the copper core bumps thus formed has a large height and a small diameter, the semiconductor device can easily be mounted on a motherboard, and troubles such as the peeling-off of a board can be reduced.

Inasmuch as the conventional step of processing a mask dry film can be used, any additional steps required are few. This is also effective in mass-producing semiconductor devices and increasing the reliability of the semiconductor device.

BEST MODE FOR CARRYING OUT THE INVENTION

The present invention will be described below in detail with reference to the accompanying drawings.

1st Embodiment

Figure 1:
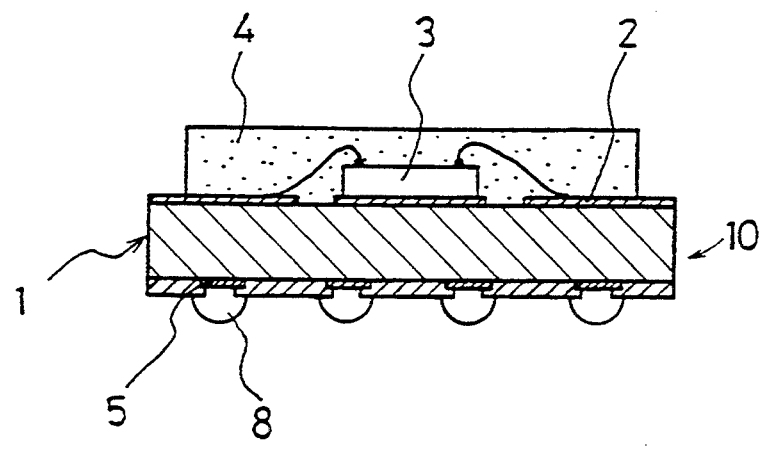
FIG. 1 is a cross-sectional view of a semiconductor device with copper core bumps according to a first embodiment of the present invention.

FIG. 1 shows in cross section a memory device with copper core bumps according to a first embodiment of the present invention.

Figure 15:
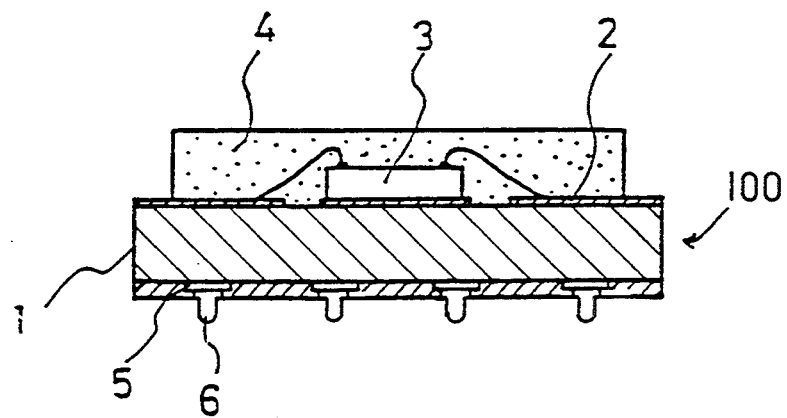
FIG. 15 is a cross-sectional view of a conventional short-pin-type semiconductor device.
Figure 16:
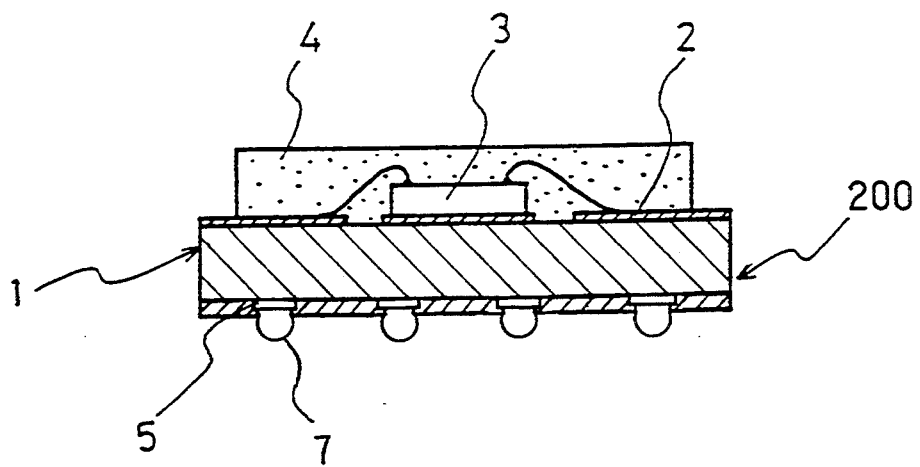
FIG. 16 is a cross-sectional view of a conventional solder-bump-type semiconductor device.

The semiconductor (memory) device, denoted at 10, has circuit patterns formed on respective upper and lower surfaces of a circuit board 1 and interconnected by through holes (not shown), and an IC chip 3 mounted on the upper pattern 2 and molded in a sealing resin block 4. The memory device 10 also has copper core bumps 8 formed as external connection terminals on the lower pattern 5 by a plating process. The memory device 10 differs from the memory device 100 shown in FIG. 15 and the memory device 200 shown in FIG. 16 in that the external connection terminals are the copper core bumps 8 directly formed on the lower pattern 5.

To mount the memory device 10 of the above structure on a motherboard, a solder-plated layer (produced by immersion in a solder layer or the like) or a conductive adhesive is applied to a pattern on the motherboard, and then the copper core bumps 8 of the memory device 10 are positioned and placed on the pattern. Thereafter, the assembly is heated to melt the solder-plated layer or the conductive adhesive, thereby surface-mounting the memory device 10 on the motherboard.

A method of forming the copper core bumps according to the first embodiment will be described below.

Figure 2:
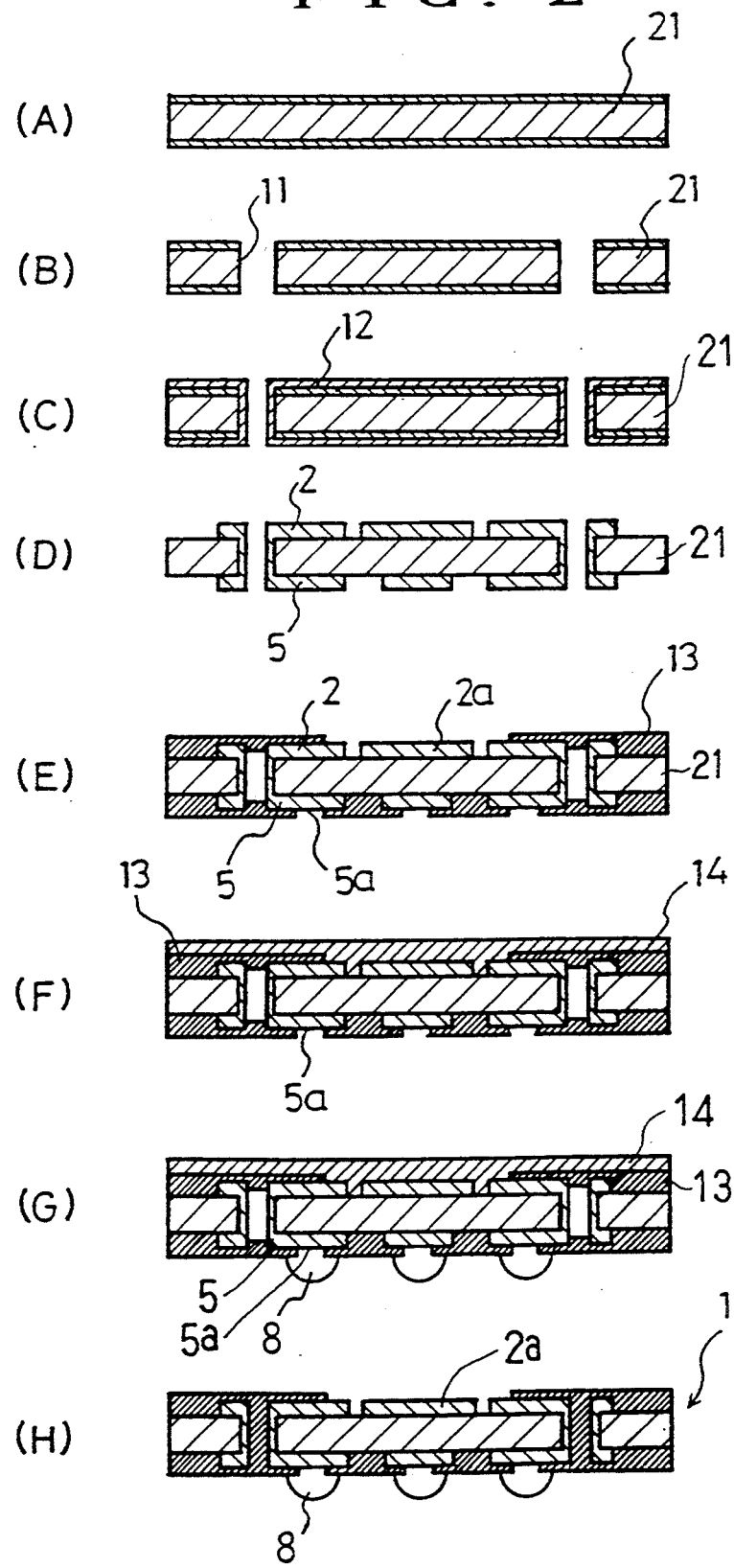
FIG. 2 is a diagram showing a method of forming copper core bumps according to the first embodiment of the present invention.

FIG. 2 shows a method of forming the copper core bumps according to the first embodiment. In a step A, a copper-lined laminated board 21 which is shown in cross section comprises a resin board whose both surfaces are lined with thin copper foil.

A step B is a step of forming through holes 11 in the copper-lined laminated board 21 with a boring machine such as an NC boring machine.

A step C is a copper plating step in which the surfaces of the copper-lined laminated board 21 including wall surfaces of the through holes 11 are cleaned, and then a thin copper-plated layer is formed on the entire surfaces of the copper-lined laminated board 21 by an electroless plating process, followed by the formation of a copper-plated layer 12 by way of an electrolytic plating process.

In a step D which is a patterning step, a plated resist is laminated, exposed to radiation, and developed into pattern masks. Thereafter, using an ordinary circuit board etching solution of $CuCl_2 + H_2O_2$, the copper-plated layer 12 is etched to form upper and lower patterns 2, 5 through the pattern masks.

A step E is a step of laminating a resist/dry film 13 (hereinafter referred to as a "resist DF"). Specifically, a resist DF 13 is laminated on both surfaces of the copper-lined laminated board 21, and exposed to radiation and developed, forming resist pattern openings at a die pattern 2a of the upper pattern 2 and bump forming regions 5a of the lower pattern 5.

A step F is a step of laminating a mask/dry film (hereinafter referred to as a "mask DF"). Specifically, a mask DF 14 is laminated on the upper surface of the copper-lined laminated board 21 over the resist DF 13, thereby masking the die pattern 2a.

A step G is a copper plating step of forming copper core bumps. Specifically, copper core bumps 8 are formed in the bump forming regions 5a of the lower pattern 5, which are open, according to an electrolytic copper plating process.

A step H is a step of developing a mask/dry film. Specifically, the mask DF 14 is removed, completing a circuit board 1. Then, the IC chip 3 is mounted on the die pattern 2a of the circuit board 1, and molded in the sealing resin block 4, thereby completing the memory device 10 shown in FIG. 1.

Figure 3:
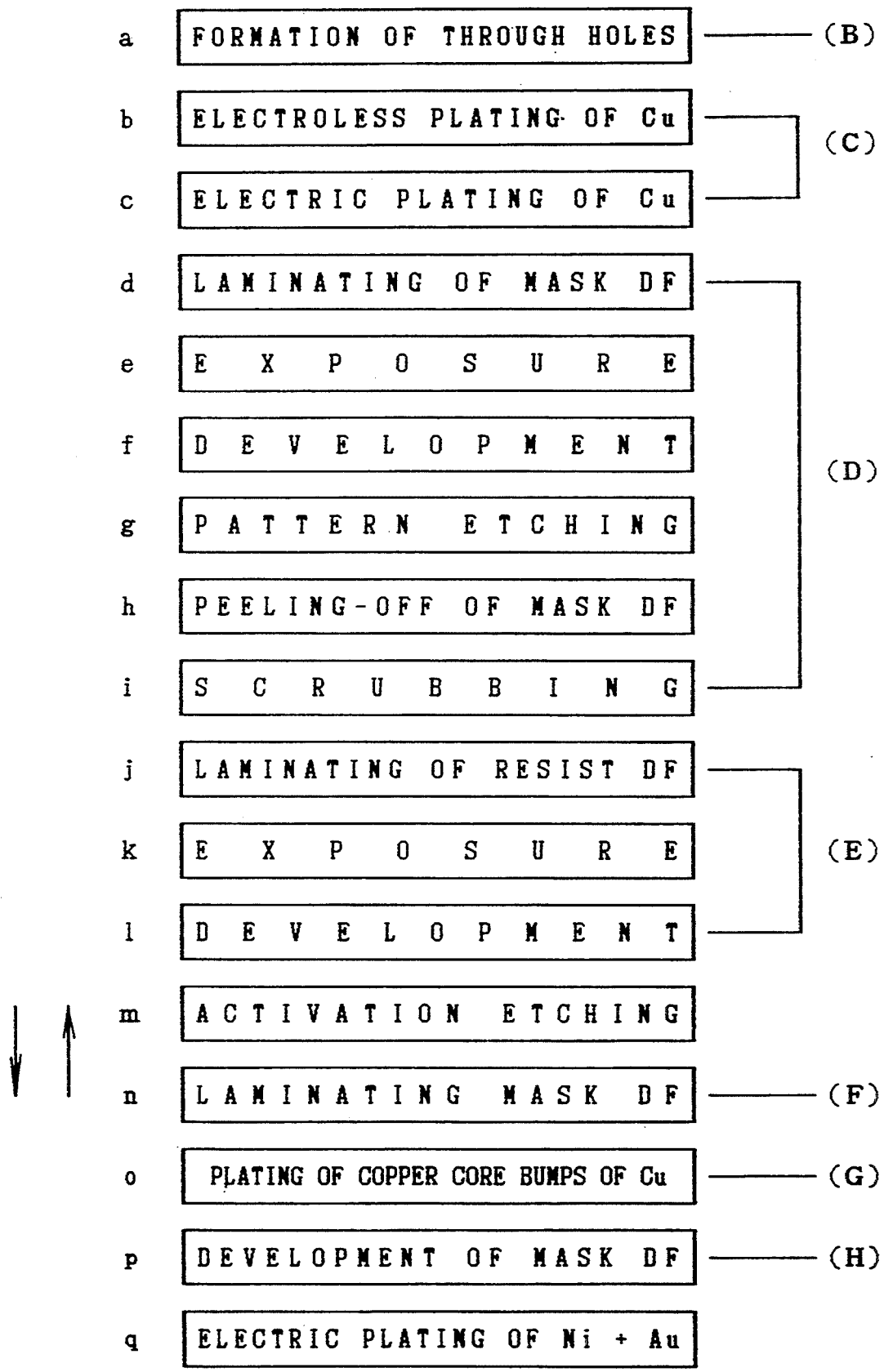
FIG. 3 is a diagram showing in detail the method of forming the copper core bumps according to the first embodiment of the present invention.

FIG. 3 shows in greater detail the method of manufacturing the copper core bumps shown in FIG. 2. The method is composed of a step a of forming through holes, a step b of plating copper electrolessly, a step c of plating copper electrolytically, a step d of laminating a mask DF, a step e of exposing the mask DF, a step f of developing the mask DF, and a step g of etching copper-plated layer into patterns. As described above, the copper-plated layer is etched to form patterns using the circuit board etching solution of $CuCl_2 + H_2O_2$.

The method also comprises a step h of removing the mask DF, a step i of scrubbing the assembly, a step j of laminating a resist DF, a step k of exposing the resist DF to radiation, a step l of developing the resist DF, and a step m of activation etching. In the step m, the resist DF is etched for a short period of time of about 15 seconds using the etching solution ($CuCl_2 + H_2O_2$) employed in the pattern etching step g. The need for the activation etching step m will be described later on.

The method further includes a step n of laminating a mask DF, a copper plating step o of forming copper core bumps, a step p of developing the mask DF, and a step q of electrically plating Ni+Au. In the step q, an Au-plated layer is formed on the surfaces of the copper core bumps 8 and the die pattern 2a.

The steps shown in FIG. 3 and the steps shown in FIG. 2 are related to each other such that the step a corresponds to the step B, the steps b, c to the step C, the steps d, e, f, g, h, i to the step D, the steps j, k, l to the step E, the step n to the step F, the step o to the step G, and the step p to the step H.

Figure 4:
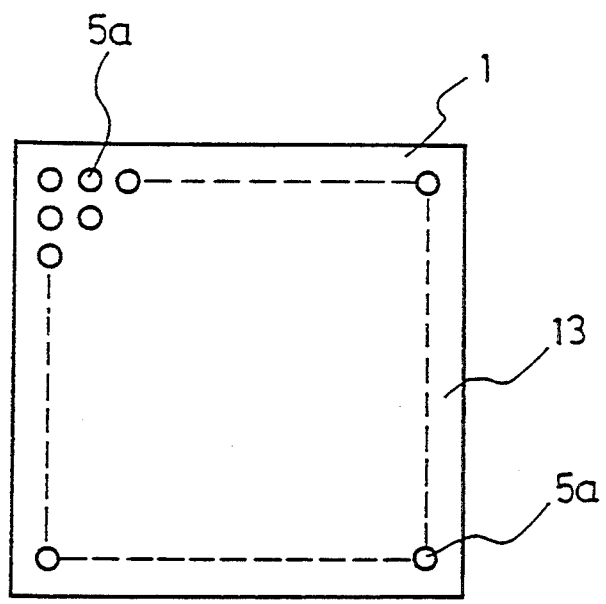
FIG. 4 is a plan view of a circuit board of the semiconductor device according to the first embodiment of the present invention.

The need for the activation etching step m shown in FIG. 3 will be described below. FIG. 4 shows in plan the circuit board 1 upon completion of the step E of laminating the resist DF shown in FIG. 2. In FIG. 4, a number of bump forming regions 5a which are formed as openings in the resist DF 13 are arranged in arrays.

Figure 5:
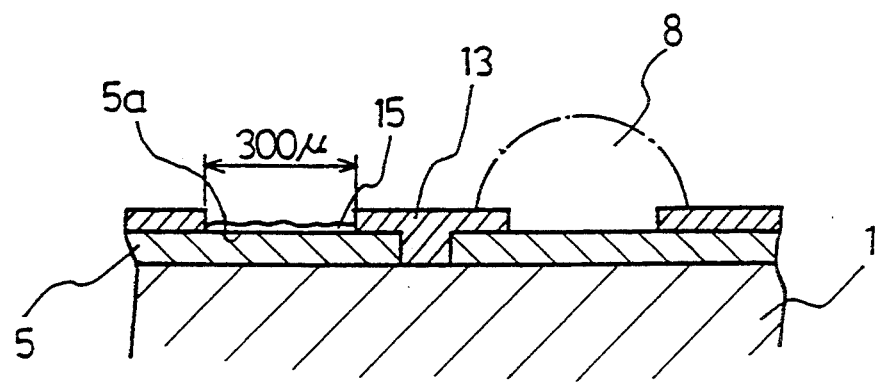
FIG. 5 is an enlarged fragmentary cross-sectional view of the circuit board shown in FIG. 4.

FIG. 5 shows in enlarged cross section the circuit board 1 illustrated in FIG. 4. In this embodiment, the resist DF 13 has a thickness of 35 μm, and each of the bump forming regions 5a has a diameter of 300 μm.

In the case where a number of small-diameter openings are defined in the resist DF 13 in the developing step l, residues 15 of the resist DF 13 that has been dissolved by a developing solution (1,1,1-trichloroethane) remain deposited on the upper surface of each of the bump forming regions 5a. If the step G of plating Cu to form copper core bumps were carried out with the residues 15 remaining, copper core bumps 8 would not adhere well, and the resultant product would be defective.

In order to solve the problem of such an adhesion failure, the inventor conducted an experiment on various pre-treatment processes. The results of the experiment are given in the following table 1:

TABLE 1

| Processing conditions | Non-defective product percentage | Problems |
|---|---|---|
| 1. No pre-treatment | 0% | After DF (development, residues remained on copper pattern in bump forming regions, and all bumps suffered an adhesion failure |
| 2. Soft etching: Immersed in $H_2SO_4$ + $H_2O_2$ solution for 60 seconds. | 0% | Activation of copper surface was weak, and residues could not fully be removed (even in longer time) |
| 3. Chemical etching process: Immersed in $H_3PO_4$ + $HNO_3$ + HCL solution twice for 10 seconds. | 100% | Chemical etching solution deteriorated considerably, and needed to be renewed in 10~20 m². Not suitable for automatization. Gave off odor, impairing working environment. |
| 4. Activation etching: Showered with $CuCl_2$ + $H_2O_2$ solution for 15 seconds. | 100% | Suitable for automatization as etching solution could be shared and had long service life. Working environment not impaired. |

As shown in Table 1 above, the results of the experiment under the four conditions are as follows:

With no pre-treatment under the condition (1), deposition of the residues 15 of the resist DF 13 dissolved in the developing solution caused all copper core bumps 8 to suffer an adhesion failure, and the non-defective product percentage was 0 %.

When soft etching (immersed in $H_2SO_4+H_2O_2$ solution for 60 seconds) was carried out as a pre-treatment under the condition (2), the activation of the copper surface was so weak that it was not possible to remove the residues 15. The non-defective product percentage was 0%.

When a chemical etching process (immersed in $H_3PO_4+HNO_3+HCL$ solution twice for 10 seconds) was carried out as a pre-treatment under the condition (3), the copper surface was activated to produce adhesion forces for copper core bumps 8. The non-defective product percentage was 100%.

When activation etching (showered with $CuCl_2+H_2O_2$ solution for 15 seconds) was carried out as a pre-treatment under the condition (4), the copper surface was activated to produce adhesion forces for copper core bumps 8. The non-defective product percentage was 100%.

Since it was found out that the chemical etching process under the condition (3) and the activation etching under the condition (4) were good, these two conditions were compared.

As a result, the chemical etching process under the condition (3) was not suitable for automatization as the chemical etching solution deteriorated considerably and needed to be renewed in 10~200 m². This process gave off a strong odor, causing a working environment problem. It was found out that the activation etching under the condition (4) was suitable for automatization and could easily be controlled for use on a mass-production line as the same etching as used in the pattern etching step g could be used.

For the reasons described above, according to this embodiment, as shown in FIG. 3, after the step 1 of developing the resist DF 13, the activation etching step m is added to activate the surfaces of the bump forming regions 5a. Thereafter, the step o of plating the copper core bumps Cu is effected to form copper core bumps 8 that adhere strongly.

While the step n of laminating the mask DF is carried out after the activating etching step m in this embodiment, these steps may be switched around as indicated by the arrows. However, in this embodiment, if the etching step is carried out before the mask DF laminating step, since the upper pattern 2 including the die pattern 2a is also activated, better results are obtained for die bonding of the IC chip 3 or the like.

The etching rate for the above activation etching should preferably be in the range of 5 to 15% of the pattern thickness. To achieve such etching rate, the assembly should be showered or immersed for 2~30 seconds depending on the deposition of residues 15.

2nd Embodiment

Figure 6:
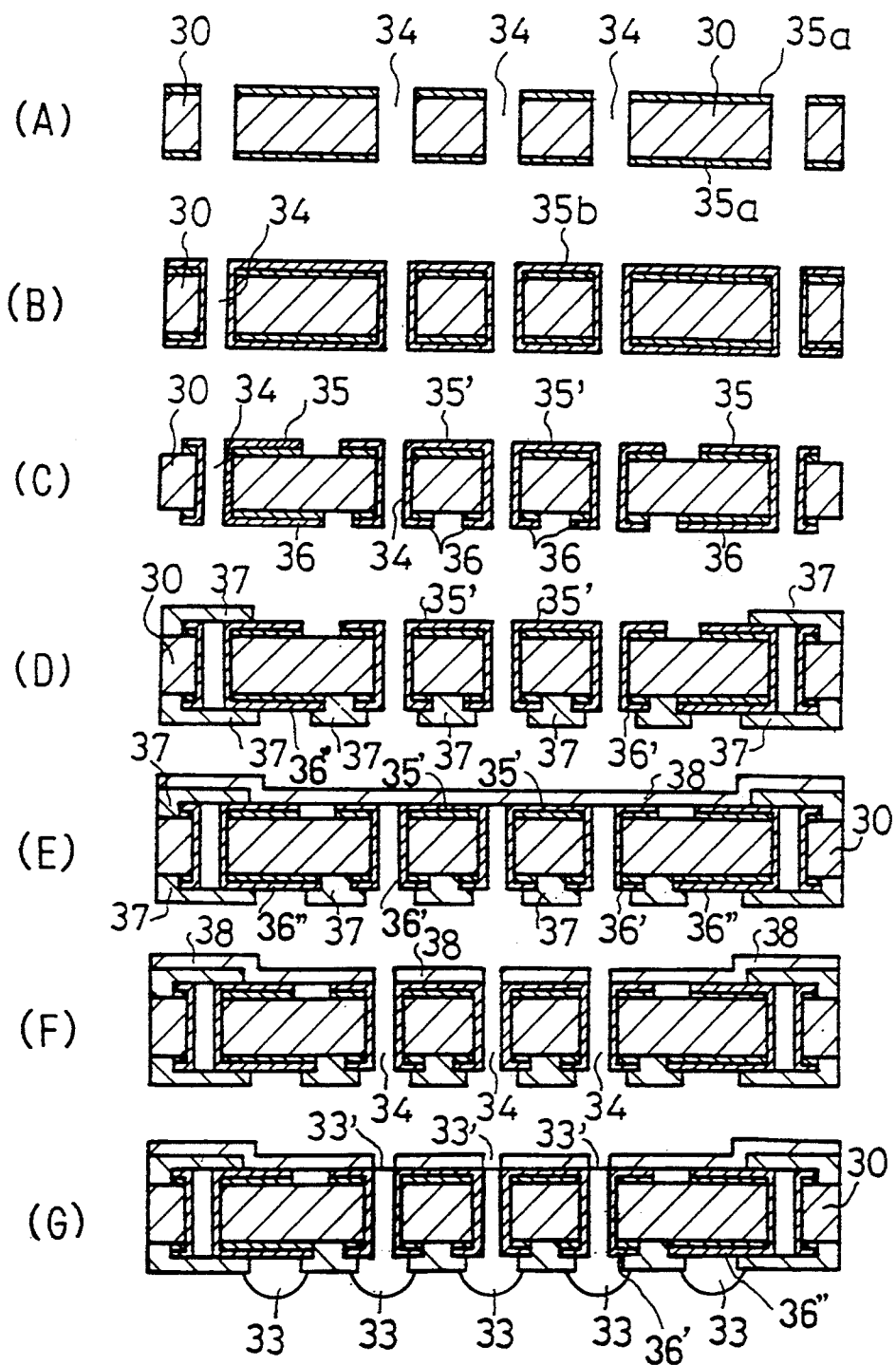
FIG. 6 is a diagram showing a method of forming copper core bumps according to a second embodiment of the present invention.
Figure 7:
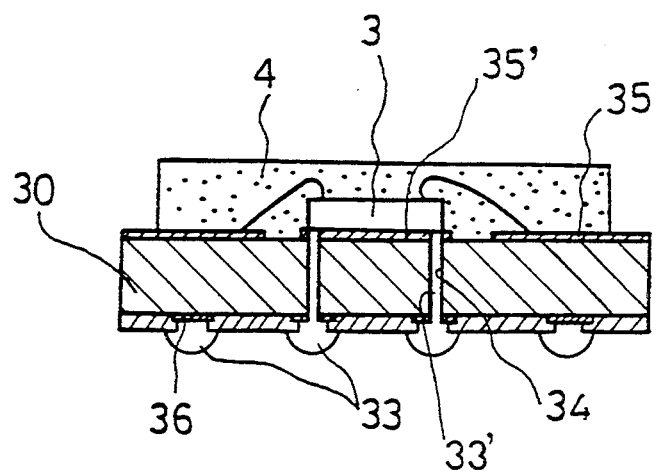
FIG. 7 is a cross-sectional view of a semiconductor device with copper core bumps according to the second embodiment of the present invention.

FIG. 6 shows in cross section a process of manufacturing a semiconductor device with copper core bumps according to a second embodiment of the present invention. FIG. 7 shows in cross section the semiconductor device that is completed.

The semiconductor device shown in FIG. 7 has an IC chip 3 placed on a die bond pattern 35' of a resin substrate 30 and connected to a pattern 35 on the resin substrate 30 by wires. The IC chip 3 is sealed in an injection-molded resin block 4. The resin substrate 30 supports a plurality of lower patterns 36 on its lower surface, with copper core bumps 33 formed on the respective lower patterns 36. The die bond pattern 35' is connected to the lower patterns 36 through through holes 34 which are filled with copper-plated fillings 33'. Heat from the IC chip 3 is radiated through the die bond pattern 35', the copper-plated fillings 33' in the through holes 34, and the copper core bumps 33 on the lower surface.

To mount the semiconductor device of the above structure on a motherboard, a solder-plated layer (produced by immersion in a solder layer or the like) or a conductive adhesive is applied to a pattern on the motherboard, and then the copper core bumps 33 of the semiconductor device are positioned and placed on the pattern. Thereafter, the assembly is heated to melt the solder-plated layer or the conductive adhesive, thereby surface-mounting the semiconductor device on the motherboard.

A method of forming the copper core bumps 33 according to the second embodiment will be described below.

FIG. 6 shows a method of forming the copper core bumps according to the second embodiment.

In a step A, a copper-lined laminated board which is shown in cross section comprises a resin board 30 whose both surfaces are lined with thin copper foil 35a. Through holes 34 are formed in the copper-lined laminated board with a boring machine such as an NC boring machine.

A step B is a copper plating step in which the surfaces of the copper-lined laminated board including wall surfaces of the through holes 34 are cleaned, and then a thin copper-plated layer 35b is formed on the entire surfaces of the copper-lined laminated board by an electroless plating process, followed by the deposition of a thick copper-plated layer by way of an electrolytic plating process.

In a step C which is a patterning step, a plated resist (not shown) is laminated, exposed to radiation, and developed into pattern masks. Thereafter, using an ordinary circuit board etching solution of CuCl2+H2O2, the copper-plated layer 35b is etched into an upper pattern 35, a die bond pattern 35', and a lower pattern 36 through the pattern masks.

A step D is a step of coating a resist 37 on both surfaces of the copper-lined laminated board by way of screen printing. By exposing and developing the resist 37, openings are defined in the resist 37 at the die bond pattern 35', lands 36' and bump forming regions 36" of the lower pattern 36.

A step E is also a step of coating the upper resist. In the step E, a mask/dry film (hereinafter referred to as a "mask DF") 38 is laminated on the resist 37 on the copper-lined laminated board thereby to mask the die bond pattern 35'.

A step F is a step of boring the mask DF. The mask DF is bored in positions corresponding to the through holes 34.

A step G is a copper plating step of forming copper core bumps. Specifically, copper core bumps 33 are formed on the lands 36' and the bump forming regions 36" of the lower pattern 36, which are open, according to an electrolytic copper-plating process. At the same time, the through holes 34 are filled with copper-plated fillings 33', thereby interconnecting the upper and lower patterns 35, 36 of the copper-lined laminated board with thick copper fillings.

After the step G, the mask DF 38 is removed by a process (not shown) of developing the mask/dry film. After the copper core bumps are formed, an Au-plated layer is formed on the surfaces of the copper core bumps 33 and the die bond pattern 35' in a step (not shown) of electrically plating Ni+Au, thereby completing a circuit board. The IC chip 3 is mounted on the die bond pattern 35' of the circuit board, and molded in the injection-molded resin block 4, whereupon the semiconductor device shown in FIG. 7 is completed.

3rd Embodiment

Figure 8:
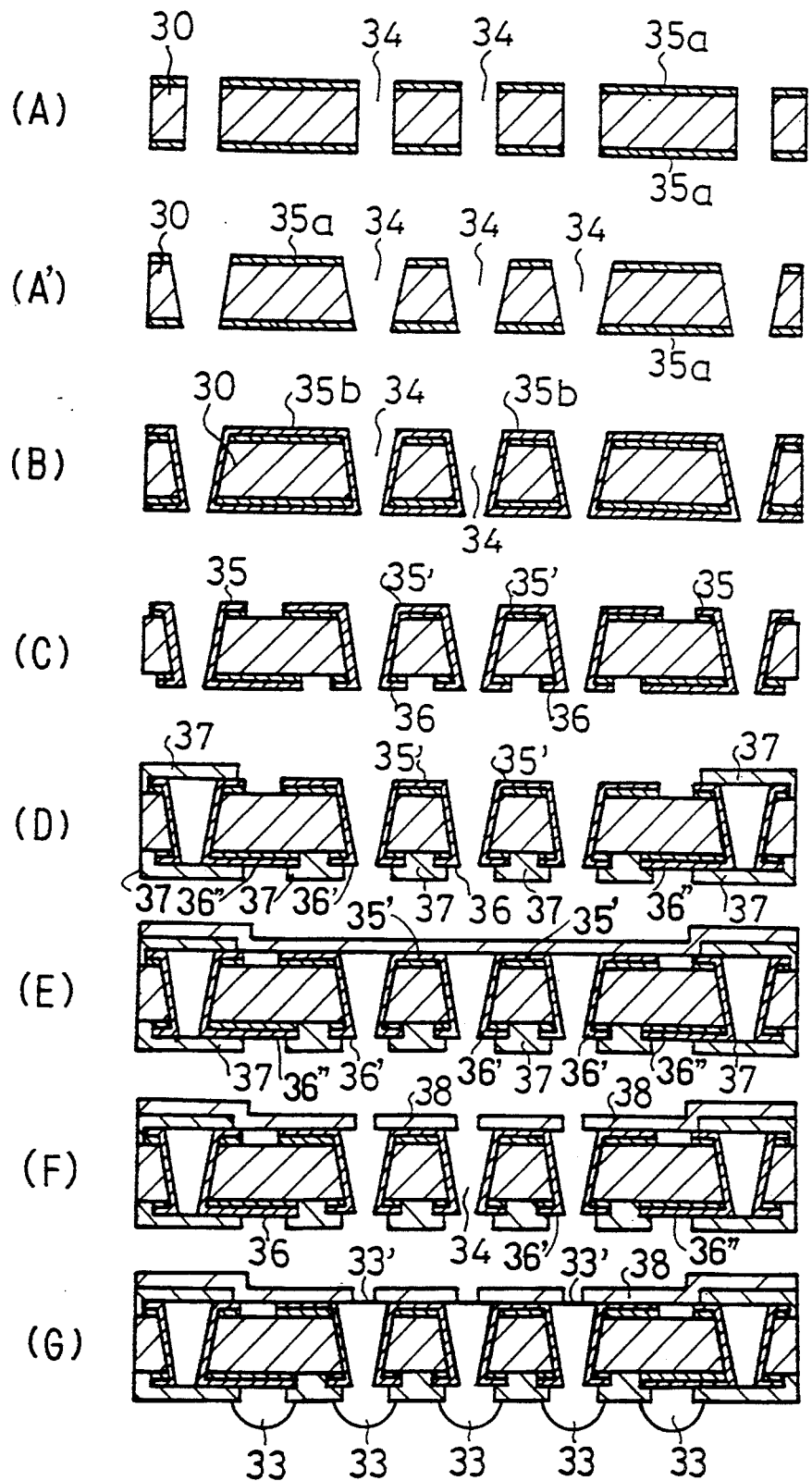
FIG. 8 is a diagram showing a method of forming copper core bumps according to a third embodiment of the present invention.

A third embodiment of the present invention will be described below. FIG. 8 shows in cross section a process of manufacturing a semiconductor device with copper core bumps according to a third embodiment of the present invention.

The third embodiment is different from the second embodiment in that the through holes 34 are of a tapered shape. More specifically, as shown in FIG. 8, the step A is followed by a step A' of cutting the through holes 34 into a tapered shape. In the copper plating step of forming copper core bumps, the copper-plated fillings 33' can easily be filled in the tapered through holes 34.

4th Embodiment

Figure 9:
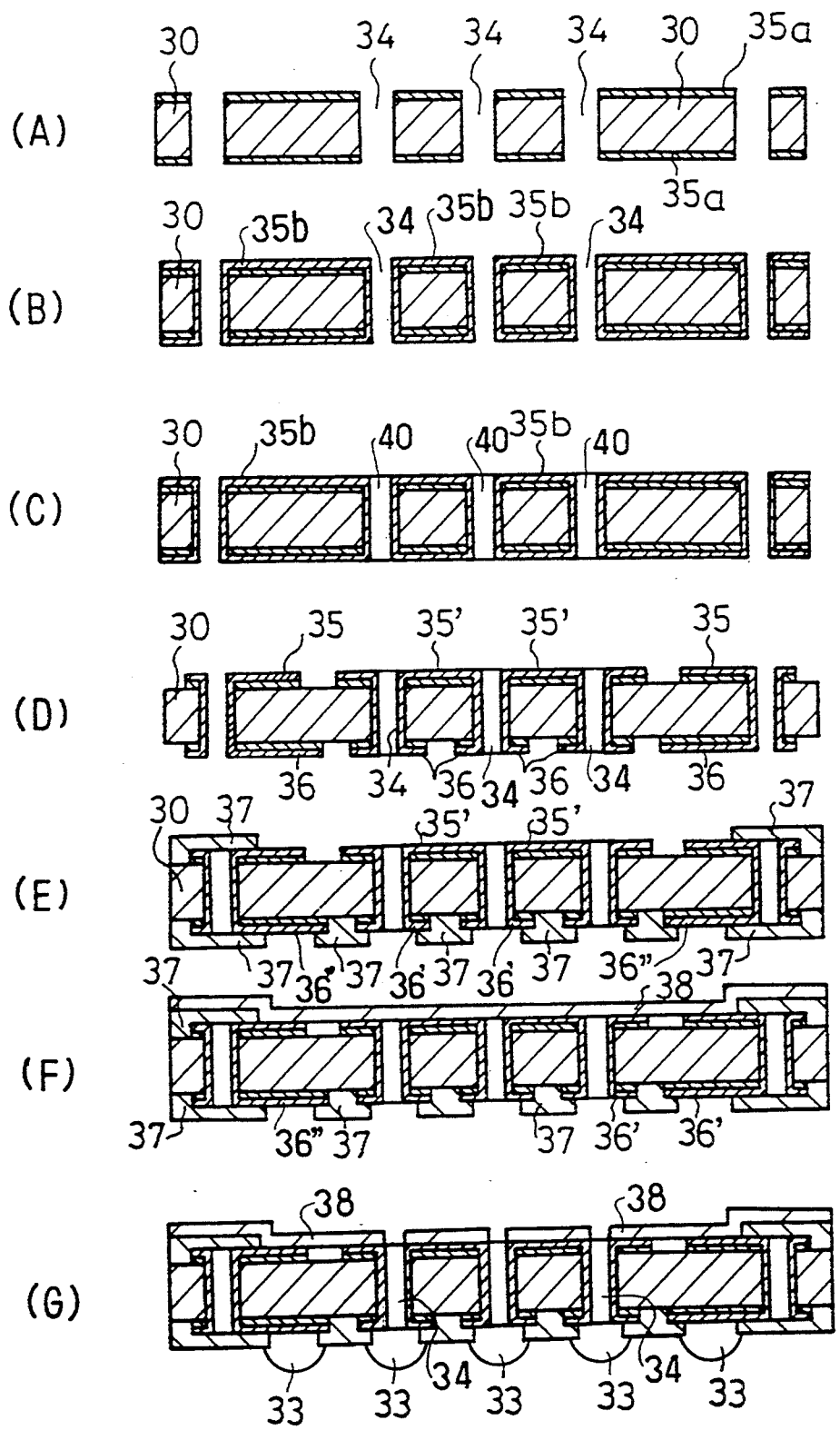
FIG. 9 is a diagram showing a method of forming copper core bumps according to a fourth embodiment of the present invention.

A fourth embodiment of the present invention will be described below. FIG. 9 shows in cross section a process of manufacturing a semiconductor device with copper core bumps according to a fourth embodiment of the present invention.

While the through holes 34 are filled with copper-plated fillings at the same time the copper core bumps are formed in the previous embodiments, a paste-like thermally conductive material is used to fill the through holes according to the fourth embodiment.

In a step A, a copper-lined laminated board which is shown in cross section comprises a resin board 30 whose both surfaces are lined with thin copper foil 35a. Through holes 34 are formed in the copper-lined laminated board with a boring machine such as an NC boring machine.

A step B is a copper plating step in which the surfaces of the copper-lined laminated board including wall surfaces of the through holes 34 are cleaned, and then a thin copper-plated layer 35b is formed on the entire surfaces of the copper-lined laminated board by an electroless plating process, followed by the deposition of a thick copper-plated layer by way of an electrolytic plating process.

A step C is a step of filling the through holes 34 with a silver paste 40 which may be a mixture of epoxy resin and silver particles.

In a step D which is a patterning step, a plated resist (not shown) is laminated, exposed to radiation, and developed into pattern masks. Thereafter, using an ordinary circuit board etching solution of CuCl2+H2O2, the copper-plated layer 12 is etched into an upper pattern 35, a die bond pattern 35', and a lower pattern 36 through the pattern masks.

A step E is a step of coating a resist 37 on both surfaces of the copper-lined laminated board by way of screen printing. By exposing and developing the resist 37, openings are defined in the resist 37 at the die bond pattern 35', lands 36' and bump forming regions 36" of the lower pattern 36.

A step F is also a step of coating the upper resist. In the step E, a mask/dry film (hereinafter referred to as a "mask DF") 38 is laminated on the resist 37 on the copper-lined laminated board thereby to mask the die bond pattern 35'.

A step G is a copper plating step of forming copper core bumps. Specifically, copper core bumps 33 are formed on the lands 36' and the bump forming regions 36" of the lower pattern 36, which are open, according to an electrolytic copper plating process.

After the step G, the mask DF 38 is removed by a process (not shown) of developing the mask/dry film. After the copper core bumps are formed, an Au-plated layer is formed on the surfaces of the copper core bumps 33 and the die bond pattern 35' in a step (not shown) of electrically plating Ni+Au, thereby completing a circuit board.

The IC chip 3 is mounted on the die bond pattern 35' of the circuit board, and molded in the injection-molded resin block 4, whereupon the semiconductor device shown in FIG. 7 is completed.

Figure 10:
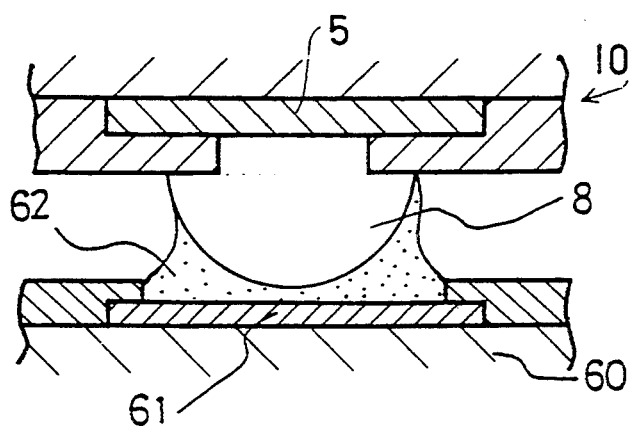
FIG. 10 is a fragmentary cross-sectional view showing the manner in which a conventional copper core bump is mounted.

FIG. 10 shows in cross section the manner in which the copper core bumps 8 are mounted in the memory device 10 shown in FIG. 1. To mount the memory device on a motherboard 60, a solder-plated layer 62 (produced by immersion in a solder layer or the like) is applied to a pattern 61 on the motherboard 60, and then the copper core bumps 8 of the memory device 10 are positioned and placed on the pattern 61. Thereafter, the assembly is heated to melt the solder-plated layer 62, thereby surface-mounting the memory device 10 on the motherboard 61.

To surface-mount the memory device 10, the copper core bumps 8 require a height of about 300 μm. If the copper core bumps 8 of a height of 300 μm are formed directly on the resist DF 13 by plating, each of the copper core bumps 33 has a large diameter of about 800 microns. Therefore, it is difficult to increase the number of bumps, and as shown in FIG. 10, and the area of contact between the arcuate copper layer of the copper core bumps 8 and the solder layer 62 is large relatively to the amount of solder of the solder layer 62. As a consequence, when a thermal shock is applied to the semiconductor device, the board may be peeled off due to a thermal strain caused by different coefficients of linear expansion.

5th Embodiment

The fifth embodiment is an improvement over the fourth embodiment, and is directed to a semiconductor device which can easily be mounted, less suffers a trouble such as the peeling-off of a board, and can be manufactured less costly, and a method of manufacturing such a semiconductor device.

Figure 11:
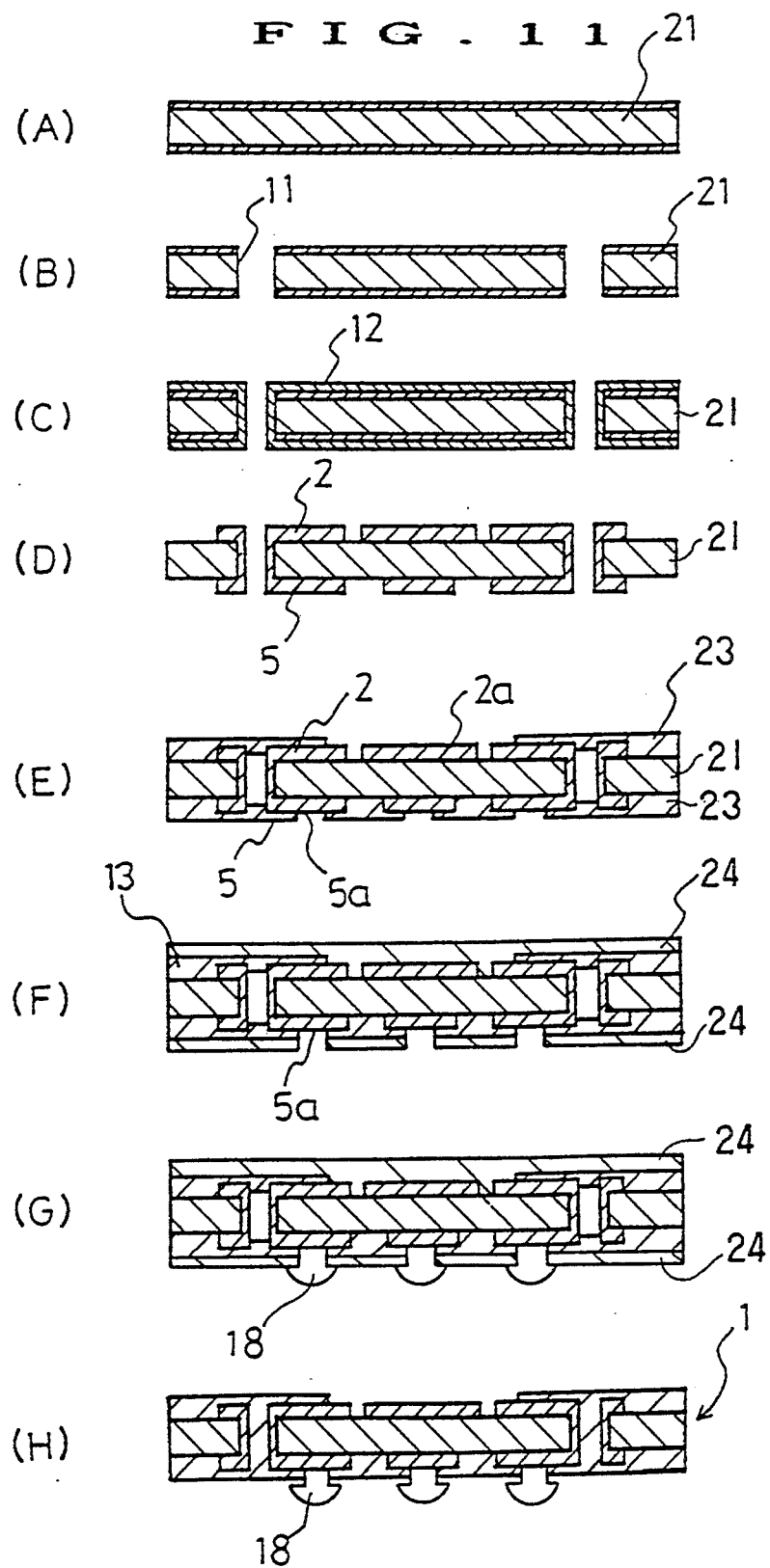
FIG. 11 is a diagram showing a method of forming copper core bumps according to a fifth embodiment of the present invention.

The fifth embodiment will be described below with reference to FIGS. 11 and 12. FIG. 11 shows a method of forming copper core bumps in the semiconductor device according to the fifth embodiment. In a step A, a copper-lined laminated board 21 which is shown in cross section comprises a resin board whose both surfaces are lined with thin copper foil.

A step B is a step of forming through holes 11 in the copper-lined laminated board 21 with a boring machine such as an NC boring machine.

A step C is a copper plating step in which the surfaces of the copper-lined laminate board 21 including wall surfaces of the through holes 11 are cleaned, and then a thin copper-plated layer is formed on the entire surfaces of the copper-lined laminated board 21 by an electroless plating process, followed by the formation of a copper-plated layer 12 by way of an electrolytic plating process.

In a step D which is a patterning step, a plated resist is laminated, exposed to radiation, and developed into pattern masks. Thereafter, using an ordinary circuit board etching solution of CuCl2+H2O2, the copper-plated layer 12 is etched to form upper and lower patterns 2, 5 through the pattern masks.

The above steps A~D are the same as the corresponding steps in the first embodiment.

A step E is a step of laminating a first dry film. Specifically, a solvent-reactive or soluble dry film 23 (hereinafter referred to as a "solution DF") which can be developed by a triethane solution is laminated on both surfaces of the copper-lined laminated board 21, exposed to radiation, and developed, thereby forming openings in the resist pattern at the die pattern 2a of the upper pattern 2 and the bump forming regions 5a of the lower pattern 5.

A step F is a step of laminating a second dry film. Specifically, a water-soluble dry film 24 (hereinafter referred to as a "water-soluble DF") which can be developed by a caustic soda solution is laminated on both surfaces of the copper-lined laminated board 21, exposed to radiation, and developed, thereby masking the die pattern 2a and simultaneously forming openings in the bump forming regions 5a.

A step G is a copper plating step of forming copper core bumps. Specifically, copper core bumps 18 are formed in the bump forming regions 5a of the lower pattern 5 through the openings in the solution DF 23 and the water-soluble DF 24.

A step H is a step of developing the second dry film. Specifically, the water-soluble DF 24 is removed by a caustic soda solution, thus completing a circuit board 1. When the lower water-soluble DF 24 is removed, the copper core bumps 18 are mushroom-shaped.

The structure of a semiconductor device which employs this circuit board 1 is the same as the structure of the memory device 10 according to the first embodiment.

Figure 12:
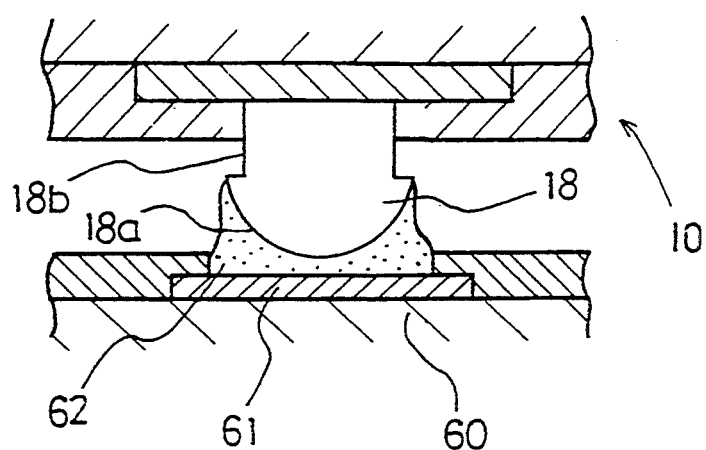
FIG. 12 is a fragmentary cross-sectional view showing the manner in which a copper core bump according to the present invention is mounted.
Figure 13:
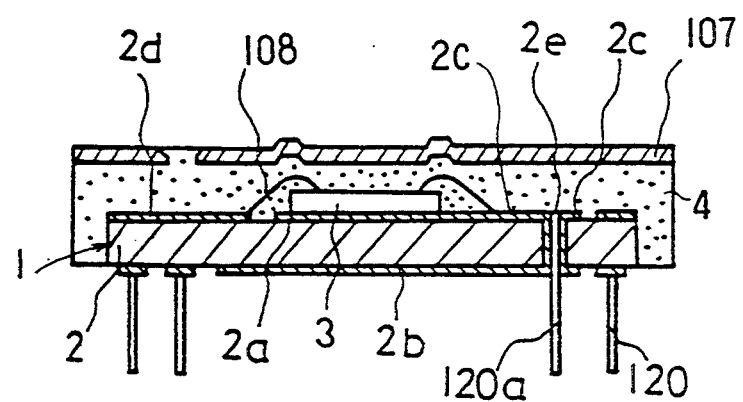
FIG. 13 is a cross-sectional view of a conventional pin-type semiconductor device.
Figure 14:
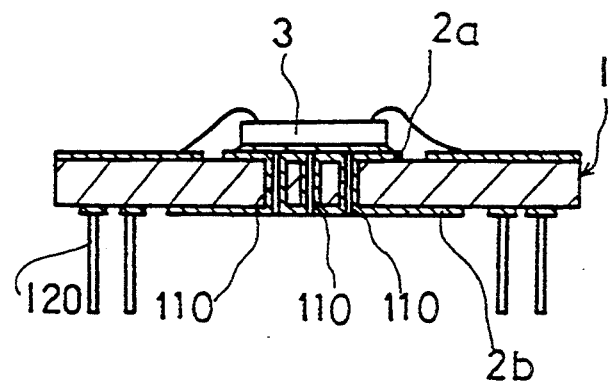
FIG. 14 is a cross-sectional view of another conventional pin-type semiconductor device.

FIG. 12 illustrates in cross section the manner in which the copper core bumps 13 are mounted. As described above, each of the copper core bumps 18 is of a mushroom shape having an arcuate potion 18a and a smaller-diameter portion 18b. When a copper core bump having a height of 300 μm is formed, the arcuate portion 18a thereof has a diameter of about 500 μm, which is smaller than the diameter of conventional copper core bumps.

As a result, such a reduction in the diameter of the copper core bumps allows the number of terminals to be increased. As shown in FIG. 12, the area of contact between the arcuate portions 18a of the copper core bumps 8 and the solder layer 62 is small relatively to the amount of solder of the solder layer 62. Because of the configuration of the smaller-diameter portion 18b, when a thermal shock is applied to the semiconductor device, any thermal strain caused by different coefficients of linear expansion is lowered, reducing a trouble such as the peeling-off of a board or the like.

The step of forming the second dry film in the method of forming bumps in the semiconductor device according to this embodiment may comprise the conventional step of processing a mask DF. The method according to this embodiment requires the addition of only a simple step to the conventional method of forming bumps, and does not involve a substantial cost increase.

A method of forming the second dry film according to this embodiment will be described below. Since a water-soluble DF having a thickness of 50 μm is generally available, optimum conditions are determined using such a water-soluble DF. First, one layer of water-soluble DF was formed, and then exposed and developed. Such a step was repeated four times to increase the thickness of the water-soluble DF up to 200 μm. Openings in the layers of water-soluble DF were positionally displaced, resulting in a failure.

Four layers of water-soluble DF were successively formed, and then exposed and developed as a whole to increase the thickness of the water-soluble DF up to 200 μm. However, the water-soluble DF of the first (lowermost) layer was not developed, resulting in a failure.

Two layers of water-soluble DF were successively formed, and then exposed and developed as a whole to increase the thickness of the water-soluble DF up to 100 μm. As a result, good openings were defined. The above step was repeated twice to increase the thickness of the water-soluble DF up to 200 μm. Though the openings were slightly displaced in position, they were sufficiently practical in use.

[Industrial applicability]

As described above, the surface-mounted semiconductor device and the method of manufacturing the same according to the present invention can effectively be utilized in various industries in which semiconductor devices of this type are manufactured and used.

We claim:

1. A method of manufacturing a semiconductor device by forming copper core bumps on a circuit pattern on a circuit board by way of plating using a resist pattern, characterized by forming a solvent-reactive first dry film and a water-soluble second dry film as successive layers as said resist pattern, and removing said second dry film after the copper core bumps are formed.

2. A method of manufacturing a circuit board for a semiconductor device, comprising:
   a through hole forming step for forming through holes in a circuit board with thin copper foils on both surfaces of the circuit board,
   a plating step for forming copper plates on the surfaces of the circuit board with the through holes,
   a patterning step for forming, by using an etching solution, a die pattern region on one surface of the circuit board and bump forming regions on the other surface of the circuit board,
   a resist/dry film laminating step for laminating resist/dry films on both surfaces of the circuit board after patterning step to thereby form resist pattern openings at the die pattern region and the bump forming regions, said resist/dry film laminating step including radiation and development,
   an activation etching step for removing residues of the resist/dry films dissolved by the radiation and development in the resist/dry film laminating step and deposited on the bump forming regions to thereby activate a surface of copper at the bump forming regions,
   a mask/dry film laminating step for laminating a mask/dry film on the resist/dry film at a side of the die pattern region to thereby mask the die pattern region,
   a bump forming step for forming copper core bumps on the bump forming regions on the board, and
   a mask/dry film developing step for removing the mask/dry film on the resist/dry film.

3. A method of manufacturing a circuit board according to claim 2, wherein removal of residues of the resist/dry films in the activation etching step is made by using the etching solution used in the patterning step.

4. A method of manufacturing a circuit board according to claim 3, wherein the removal of the residues of the resist/dry film in the activation etching step is performed for 5–30 seconds.

5. A method of manufacturing a circuit board according to claim 4, wherein said patterning step includes laminating mask dry films, exposing and developing the mask dry films, and etching the copper plates on the circuit board by the etching solution.

* * * * *